US012217692B2

(12) United States Patent
Na et al.

(10) Patent No.: US 12,217,692 B2
(45) Date of Patent: Feb. 4, 2025

(54) ORGANIC LIGHT EMITTING DIODE DISPLAY

(71) Applicant: Samsung Display Co., Ltd., Yongin-si (KR)

(72) Inventors: Ji Su Na, Yongin-si (KR); Joong-Soo Moon, Hwaseong-si (KR); Chae Han Hyun, Hwaseong-si (KR); Yang Wan Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/119,419

(22) Filed: Mar. 9, 2023

(65) Prior Publication Data

US 2023/0215371 A1 Jul. 6, 2023

Related U.S. Application Data

(63) Continuation of application No. 17/525,136, filed on Nov. 12, 2021, now Pat. No. 11,610,546, which is a
(Continued)

(30) Foreign Application Priority Data

Nov. 28, 2018 (KR) .......................... 10-2018-0149532

(51) Int. Cl.
*G09G 3/325* (2016.01)
*G09G 3/3266* (2016.01)
*G09G 3/3291* (2016.01)

(52) U.S. Cl.
CPC ........... *G09G 3/325* (2013.01); *G09G 3/3266* (2013.01); *G09G 3/3291* (2013.01)

(58) Field of Classification Search
CPC ..... G09G 3/325; G09G 3/3266; G09G 3/3291
See application file for complete search history.

(56) References Cited

U.S. PATENT DOCUMENTS 9,627,465 B2    4/2017   Kwon et al.
9,799,717 B2   10/2017   Jung
(Continued)

FOREIGN PATENT DOCUMENTS

CN    105336295 A    2/2016
CN    106486526 A    3/2017
(Continued)

OTHER PUBLICATIONS

Chinese Office Action—Chinese Patent Application No. 201911179959.5 dated Nov. 16, 2023, citing references listed within.

*Primary Examiner* — Peter D McLoone
(74) *Attorney, Agent, or Firm* — CANTOR COLBURN LLP

(57) ABSTRACT

An organic light emitting diode ("OLED") display includes a semiconductor layer on a substrate, first and second signal lines on the semiconductor layer, a shield layer on the first and second signal lines, a data line on the shield layer, and an OLED on the data line, where the transistor includes a driving transistor, a second transistor connected to the first signal line and the data line, and a third transistor including a gate electrode connected to the first signal line, a third electrode connected to a second electrode of the driving transistor, and a fourth electrode connected to a gate electrode of the driving transistor, the shield layer includes an overlapped portion overlapping at least a part of the connection portion and non-overlaps the second transistor, and the shield layer is separated from the first and second signal lines with a gap therebetween in a plan view.

42 Claims, 5 Drawing Sheets

Related U.S. Application Data continuation of application No. 16/697,168, filed on Nov. 26, 2019, now Pat. No. 11,176,883.

(56) References Cited

U.S. PATENT DOCUMENTS

| | | | |
|---|---|---|---|
| 9,842,892 B2 | 12/2017 | Kim et al. | |
| 10,038,046 B2 | 7/2018 | Jung | |
| 10,050,063 B2 | 8/2018 | Lee et al. | |
| 10,062,743 B2 | 8/2018 | Lee et al. | |
| 10,396,139 B2 | 8/2019 | Yoon et al. | |
| 10,431,604 B2 | 10/2019 | Cho et al. | |
| 10,439,015 B2 | 10/2019 | Kim et al. | |
| 10,468,477 B2 | 11/2019 | Jung et al. | |
| 10,510,822 B2 | 12/2019 | Kim et al. | |
| 10,559,645 B2 | 2/2020 | Kwon et al. | |
| 10,586,836 B2 | 3/2020 | Bae et al. | |
| 10,770,535 B2 | 9/2020 | Kim et al. | |
| 10,784,329 B2 | 9/2020 | Kim et al. | |
| 11,063,107 B2 | 7/2021 | Kim et al. | |
| 11,107,873 B2 | 8/2021 | Kim et al. | |
| 11,176,883 B2 * | 11/2021 | Na | G09G 3/3266 |
| 11,271,017 B2 | 3/2022 | Cho et al. | |
| 11,289,556 B2 | 3/2022 | Bae et al. | |
| 11,386,847 B2 * | 7/2022 | Byun | G09G 3/3266 |
| 11,610,546 B2 * | 3/2023 | Na | G09G 3/3266 |
| 11,631,726 B2 * | 4/2023 | Bae | H10K 59/1213 257/40 |
| 11,837,476 B2 * | 12/2023 | Zhang | H01L 21/563 |
| 11,957,016 B2 * | 4/2024 | Kwak | H10K 71/70 |
| 2016/0043159 A1 | 2/2016 | Kim et al. | |
| 2016/0210905 A1 | 7/2016 | Lee et al. | |
| 2017/0287938 A1 | 10/2017 | Lee et al. | |
| 2017/0330927 A1 | 11/2017 | Lee et al. | |
| 2017/0330928 A1 | 11/2017 | Choi et al. | |
| 2019/0197965 A1 | 6/2019 | Lee et al. | |
| 2020/0176548 A1 | 6/2020 | Kwon et al. | |
| 2020/0403058 A1 | 12/2020 | Kim et al. | |
| 2021/0335268 A1 | 10/2021 | Byun et al. | |
| 2021/0335970 A1 | 10/2021 | Kim et al. | |

FOREIGN PATENT DOCUMENTS

| | | |
|---|---|---|
| CN | 108022946 B | 10/2021 |
| KR | 1020160017394 | 2/2016 |
| KR | 1020160089939 A | 7/2016 |
| KR | 1020160098650 | 8/2016 |
| KR | 1020160105956 | 9/2016 |
| KR | 1020170115150 | 10/2017 |
| KR | 1020170127602 | 11/2017 |
| KR | 1020180092009 | 8/2018 |
| KR | 1020180125061 A | 11/2018 |
| KR | 1020180125084 | 11/2018 |

* cited by examiner

ORGANIC LIGHT EMITTING DIODE DISPLAY

This application is a continuation of U.S. patent application Ser. No. 17/525,136, filed on Nov. 12, 2021, which is a continuation of U.S. patent application Ser. No. 16/697,168, filed on Nov. 26, 2019, which claims priority to Korean Patent Application No. 10-2018-0149532, filed on Nov. 28, 2018, and all the benefits accruing therefrom under 35 U.S.C. § 119, the content of which in its entirety is herein incorporated by reference.

BACKGROUND

(a) Field

Exemplary embodiments of the invention relate to an organic light emitting diode ("OLED") display, and particularly, to an OLED display further including a shield layer.

(b) Description of the Related Art

A display device is a device for displaying images, and recently, an organic light emitting diode ("OLED") display has been paid high attention.

The OLED display has a self-emission characteristic, and it does not desire additional light source, differing from liquid crystal display devices, thereby reducing a thickness and a weight thereof. Further, the OLED display has high-quality characteristics such as low power consumption, high luminance, and high reaction speed.

The OLED display includes a plurality of signal lines and a plurality of thin film transistors ("TFT") connected thereto.

SUMMARY

Exemplary embodiments of the invention have been made in an effort to provide an organic light emitting diode ("OLED") display for reducing parasitic capacitance by minimizing an area in which a shield layer overlaps a semiconductor layer, improving displaying quality, and reducing power consumption.

An exemplary embodiment of the invention provides an OLED display including a substrate, a semiconductor layer disposed on the substrate, on which a channel region, a first region, and a second region of a transistor are provided, a first signal line and a second signal line disposed on the semiconductor layer, a shield layer disposed on the first signal line and the second signal line, a data line disposed on the shield layer, and an OLED disposed on the data line, where the transistor includes a driving transistor which applies a current to the OLED, a second transistor which is connected to the first signal line and the data line, and transmits a data voltage transmitted through the data line to a first electrode of the driving transistor, and a third transistor including a gate electrode connected to the first signal line, a third electrode connected to a second electrode of the driving transistor, and a fourth electrode connected to a gate electrode of the driving transistor, the third transistor includes a 3-1 transistor and a 3-2 transistor connected in series to each other at a connection portion, the shield layer includes an overlapped portion overlapping at least a part of the connection portion and does not overlap the second transistor, and the shield layer is disposed to be separated from the first signal line and the second signal line with a gap therebetween in a plan view.

In an exemplary embodiment, the second signal line may be disposed in a same layer as the first signal line, the shield layer may include an extended portion extending from the overlapped portion, and the extended portion may extend in parallel to the first signal line and the second signal line.

In an exemplary embodiment, the shield layer may receive a driving voltage.

In an exemplary embodiment, a first gap that is a minimum distance between the shield layer and the first signal line may be 1.2 micrometers (μm) to 1.5 μm.

In an exemplary embodiment, a second gap that is a minimum distance between the shield layer and the second signal line may be 1.2 μm to 1.5 μm.

In an exemplary embodiment, the first signal line may be a scan line which transmits a scan signal.

In an exemplary embodiment, the second signal line may be a previous scan line which transmits a previous scan signal.

In an exemplary embodiment, the connection portion may be disposed on a portion where the semiconductor layer is bent.

In an exemplary embodiment, the OLED display may further include a lower voltage supplying line which is disposed in a same layer as the data line and supplies the driving voltage.

In an exemplary embodiment, the shield layer may include an expanded portion expanding from the extended portion, and the expanded portion may receive a driving voltage from the lower voltage supplying line.

In an exemplary embodiment, the OLED display may further include an upper voltage supplying line which is disposed on the lower voltage supplying line and supplies the driving voltage.

In an exemplary embodiment, the OLED display may further include an auxiliary connecting member disposed in a same layer as the upper voltage supplying line, and electrically connected to a pixel electrode of the OLED.

In an exemplary embodiment, the extended portion may overlap at least a part of the upper voltage supplying line.

In an exemplary embodiment, the transistor may include a fourth transistor connected to the third transistor, and the fourth transistor may include a gate electrode connected to the second signal line and a fifth electrode connected to the fourth electrode of the third transistor.

In an exemplary embodiment, the expanded portion of the shield layer may overlap at least a part of the fourth transistor.

In an exemplary embodiment, a minimum width of the shield layer may be 2.5 μm to 3.3 μm.

Another exemplary embodiment of the invention provides an OLED display including a substrate, a semiconductor layer disposed on the substrate, on which a channel region, a first region, and a second region of a transistor are provided, a first conductive layer disposed on the semiconductor layer and including a scan line, a second conductive layer disposed on the first conductive layer, a first data layer disposed on the second conductive layer and including a data line, and an OLED disposed on the first data layer, where the transistor includes a driving transistor which applies a current to the OLED, a second transistor which is connected to the scan line and the data line, and transmits a data voltage transmitted through the data line to a first electrode of the driving transistor, and a third transistor including a gate electrode connected to the scan line, a third electrode connected to a second electrode of the driving transistor, and a fourth electrode connected to a gate electrode of the driving transistor, the second conductive layer includes a shield layer, the shield layer overlaps at least a part of the third transistor and does not overlap the second transistor, and the shield layer does not overlap first conductive layer.

In an exemplary embodiment, the third transistor may include a 3-1 transistor and a 3-2 transistor connected in series, and the 3-1 transistor and the 3-2 transistor may be connected to each other on a connection portion.

In an exemplary embodiment, the shield layer may overlap at least a part of the connection portion.

In an exemplary embodiment, a minimum distance between the shield layer and the first conductive layer may be 1.2 µm to 1.5 µm.

According to the exemplary embodiments, the parasitic capacitance is reduced by allowing the shield layer to not overlap a specific transistor, thereby reducing power consumption of the display device. Further, the display quality may be improved, for example, the afterimage is improved, by reducing a kickback voltage.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
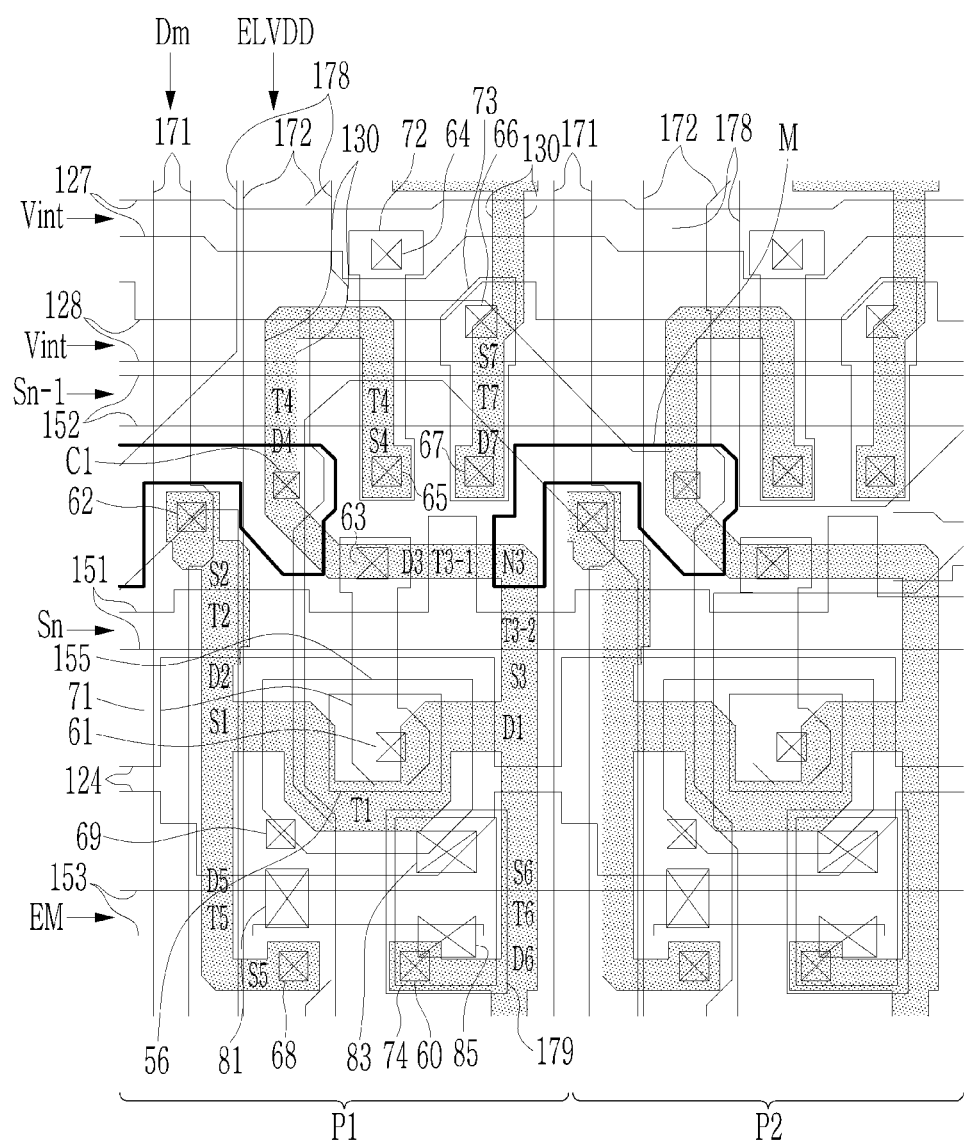
FIG. 1 shows a plan view of an exemplary embodiment of an organic light emitting diode ("OLED") display.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

The drawings and description are to be regarded as illustrative in nature and not restrictive. Like reference numerals designate like elements throughout the specification.

The size and thickness of each configuration shown in the drawings are arbitrarily shown for better understanding and ease of description, and the invention is not limited thereto. In the drawings, the thickness of layers, films, panels, regions, etc., are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" means viewing the object portion from the top, and the phrase "on a cross-section" means viewing a cross-section of which the object portion is vertically cut from the side.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An exemplary embodiment of a disposal of a pixel of an organic light emitting diode ("OLED") display will now be described with reference to FIG. 1. FIG. 1 shows a plan view of an exemplary embodiment of an OLED display.

Figure 3:
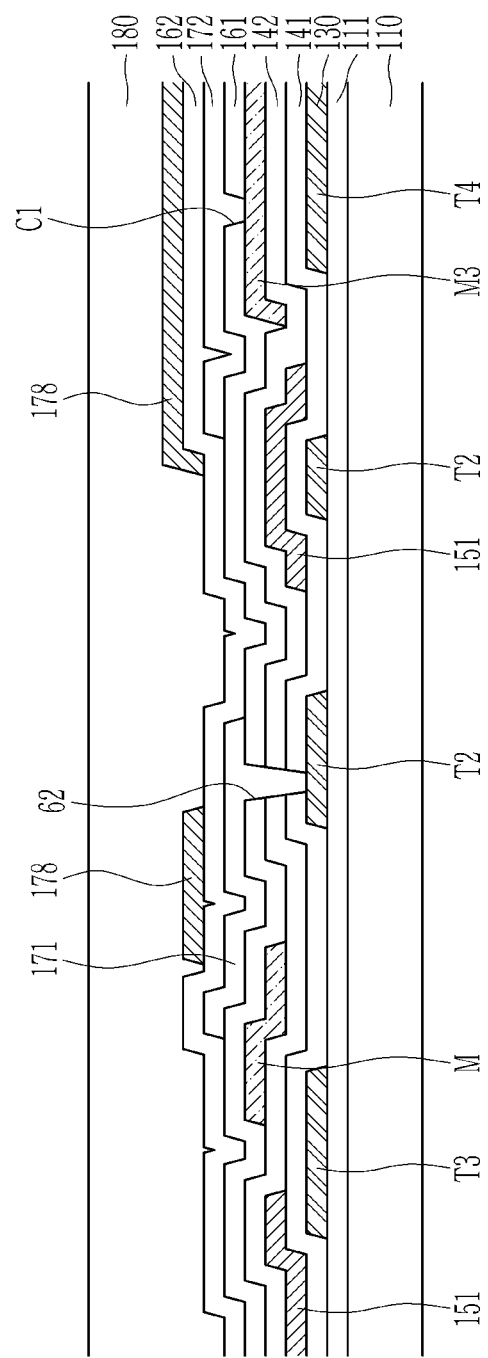
FIG. 3 shows a cross-sectional view taken along line of FIG. 2.
Figure 4:
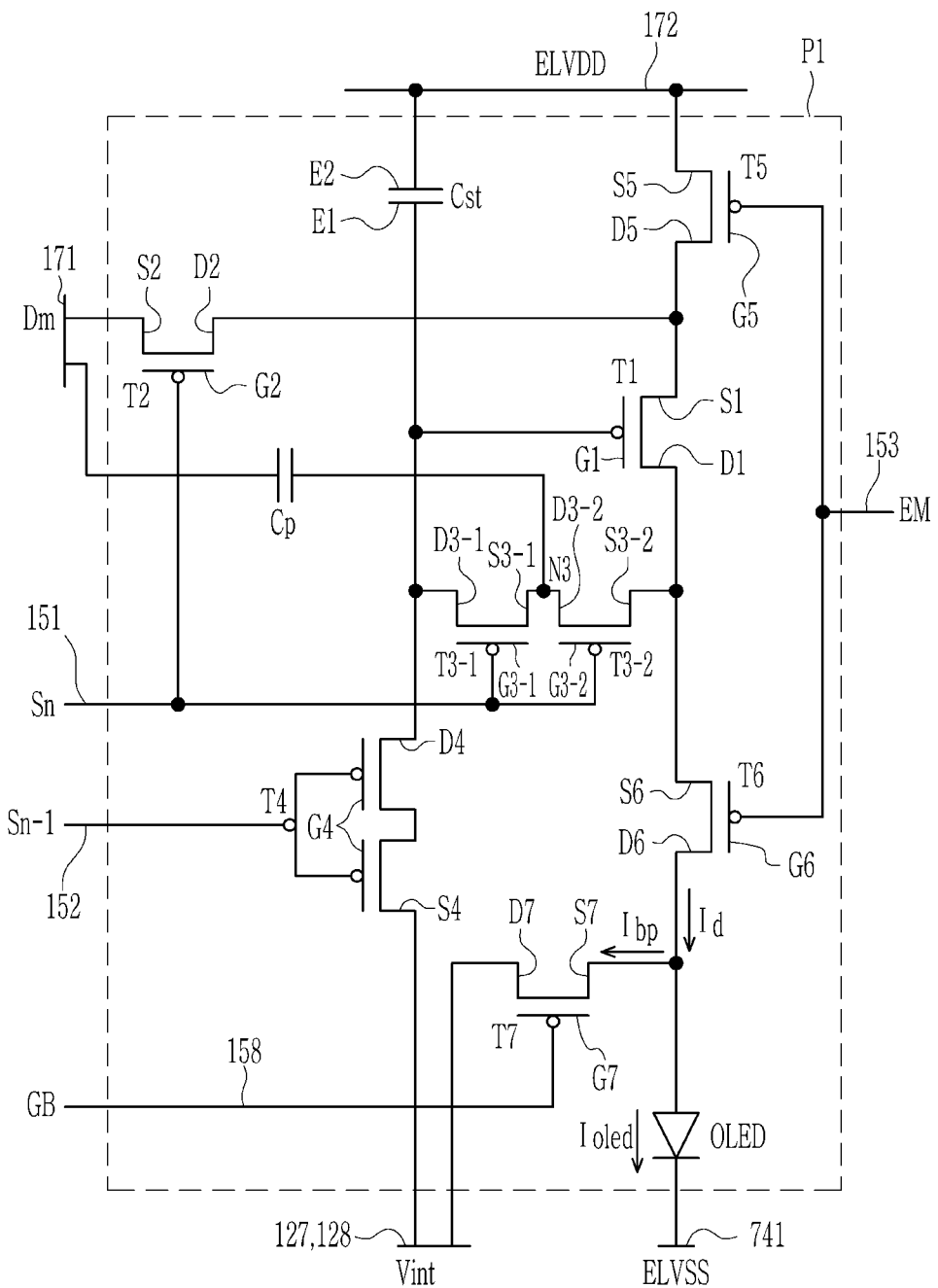
FIG. 4 shows an equivalent circuit diagram of an exemplary embodiment of a pixel of an OLED display.

Referring to FIG. 1, an exemplary embodiment of one pixel of an OLED display includes a plurality of signal lines 151, 152, 153, 127, 128, and 171, a plurality of transistors T1, T2, T3 (refer to FIG. 3), T4, T5, T6, and T7 connected to the signal lines, a storage capacitor Cst (refer to FIG. 4), voltage supplying lines 172 and 178, and an OLED (refer to FIG. 4). The signal lines 151, 152, 153, 127, 128, and 171 or the voltage supplying lines 172 and 178 may be shared by a plurality of pixels.

An exemplary embodiment of the OLED display according to the invention further includes a shield layer M, which will be described in a latter portion of the specification.

The transistors include a driving transistor T1, a switching transistor T2, a compensation transistor T3, an initialization transistor T4, an operation control transistor T5, an emission control transistor T6, and a bypass transistor T7. In an exemplary embodiment, the transistors may be thin film transistors ("TFTs"), for example The signal lines may include a scan line 151, a previous scan line 152, an emission control line 153, a bypass control line (not shown), a data line 171, a lower voltage supplying line 172, a first initialization voltage line 127, a second initialization voltage line 128, and an upper voltage supplying line 178. The bypass control line (not shown) may be a previous scan line 152 or part of the scan line 151, or it may be electrically connected thereto.

The scan line 151 transmits a scan signal Sn and the previous scan line 152 transmits a previous scan signal Sn-1 to the initialization transistor T4. The bypass control line (not shown) transmits a bypass signal GB to the bypass transistor T7, and in some exemplary embodiments, may transmit the same signal as the previous scan signal Sn-1 or the scan signal Sn thereto. The emission control line 153 transmits an emission control signal EM to the operation control transistor T5 and the emission control transistor T6.

The data line 171 traverses the scan line 151 and transmits a data signal Dm. The lower voltage supplying line 172 may transmit a driving voltage ELVDD and is provided to be substantially parallel to the data line 171, and the upper voltage supplying line 178 may be electrically connected to the lower voltage supplying line 172 to prevent the lower voltage supplying line 172 from having a voltage drop. The first initialization voltage line 127 may transmit an initialization voltage Vint for initializing the driving transistor T1, and the second initialization voltage line 128 may transmit an initialization voltage Vint for initializing an anode of the OLED.

The transistors T1, T2, T3, T4, T5, T6, and T7 are provided along a semiconductor layer 130 marked with shadows, and the semiconductor layer 130 may be provided to be bent in various shapes.

The semiconductor layer 130 includes a channel region (not shown) channel-doped with an N-type impurity or a P-type impurity, and a first region and a second region provided on respective sides of a channel having a doping concentration that is greater than that of the impurity doped to the channel. The channel region, the first region, and the second region correspond to channels of a plurality of transistors T1, T2, T3, T4, T5, T6, and T7, first electrodes S1, S2, S3, S4, S5, S6, and S7, and second electrodes D1, D2, D3, D4, D5, D6, and D7, and when one of the first region and the second region is a source region, the other corresponds to a drain region.

Further, on the semiconductor layer 130, a region between the first electrodes S1 to S7 and the second electrodes D1 to D7 of two different transistors may be doped so that the two transistors may be electrically connected to each other. In exemplary embodiments, the channel may not be doped with an impurity, and the first region and the second region may be doped with impurities.

The respective channel regions of a plurality of transistors T1, T2, T3, T4, T5, T6, and T7 overlap gate electrodes of the transistors, and are provided between the first regions and the second region thereof.

The plurality of transistors will now be described.

The driving transistor T1 includes a channel, a gate electrode 155, a first electrode S1, and a second electrode D1. The gate electrode 155 overlaps the channel in a plan view, and the first electrode S1 and the second electrode D1 are provided on respective sides of the channel. An extended portion of the storage line 124 is insulated and provided on the gate electrode 155. The extended portion of the storage line 124 overlaps the gate electrode 155 with a second gate insulating layer (142, refer to FIG. 3) therebetween to thus configure a storage capacitor Cst. The gate electrode 155 is a first electrode (E1 of FIG. 4) of the storage capacitor Cst, and the extended portion of the storage line 124 is a second storage electrode (E2 of FIG. 4).

An opening 56 is formed in the extended portion of the storage line 124 so that the gate electrode 155 may be connected to a first data connecting member 71. In the opening 56, an upper side of the gate electrode 155 is electrically connected to the first data connecting member 71 through an opening 61. The first data connecting member 71 is connected to the second electrode D3 of the compensation transistor T3 to connect the gate electrode 155 of the driving transistor T1 and the second electrode D3 of the compensation transistor T3.

The gate electrode 155 may, as shown in FIG. 1, have an island shape that is separated from the adjacent pixel. The gate electrode 155 may be disposed in a same layer and with a same material as those of the scan line 151, the previous scan line 152, and the emission control line 153.

The switching transistor T2 may be referred to as a second transistor.

A gate electrode of the switching transistor T2 may be part of the scan line 151. The data line 171 is connected to the first electrode S2 of the switching transistor T2 through an opening 62. The switching transistor T2 is used as a switching element for selecting a pixel to be emitted. The switching gate electrode is connected to the scan line 151, and the second electrode D2 is connected to the driving transistor T1 and the operation control transistor T5.

The compensation transistor T3 may be referred to as a third transistor.

The compensation transistor T3 is configured with a 3-1 transistor T3-1 and a 3-2 transistor T3-2 that are adjacent to each other and are coupled in series. The gate electrodes of the two transistors T3-1 and T3-2 may be part of the scan line 151 or a portion protruding upward from the scan line 151. The above-noted structure may be referred to as a dual gate structure, and it may function to block generation of a leakage current or reduce the same. A portion for connecting two transistors T3-1 and T3-2 on the semiconductor layer 130 is referred to as a connection portion N3.

A first electrode (not shown) of the 3-1 transistor T3-1 is connected to a second electrode (not shown) of the 3-2 transistor T3-2 at the connection portion N3. In the case of describing the compensation transistor T3 as a single transistor, the first electrode (not shown) of the 3-2 transistor T3-2 becomes a first electrode S3 of the compensation transistor T3, and the second electrode (not shown) of the 3-1 transistor T3-1 becomes a second electrode D3 of the compensation transistor T3.

When the configuration in which two transistors are connected in series is described as a single compensation transistor T3, the first electrode S3 of the compensation transistor T3 may be connected to the first electrode S6 of the emission control transistor T6 and the second electrode D1 of the driving transistor T1. The second electrode D3 of the compensation transistor T3 is connected to the first data connecting member 71 through an opening 63.

The initialization transistor T4 may be referred to as a fourth transistor.

The initialization transistor T4 is configured with two initialization transistors, and the two initialization transistors are disposed on a portion where the previous scan line 152 meets the semiconductor layer 130. The gate electrode of the initialization transistor T4 may be part of the previous scan line 152. The first electrode S4 of one initialization transistor T4 is connected to the second electrode D4 of another initialization transistor T4. This may be referred to as a dual gate structure, and it may block the leakage current or reduce the same.

A first end of a second data connecting member 72 is connected to a first electrode S4 of the initialization transistor T4 through an opening 65, and a second end of the second data connecting member 72 is connected to the first initialization voltage line 127 through an opening 64 to receive an initialization voltage Vint. The first data connecting member 71 is connected to the second electrode D4 of the initialization transistor T4 through the opening 63.

As described above, by the dual gate structure with the compensation transistor T3 and the initialization transistor T4, an electron moving path of the channel is blocked in an off state, and generation of the leakage current may be efficiently prevented.

An exemplary embodiment of the OLED display includes a shield layer M.

Referring to FIG. 1, a first pixel P1 and a second pixel P2 provided near the same in a first direction are shown. The data line 171 of the second pixel P2 transmits the data signal Dm to the pixels that are adjacent to each other upward and downward in a second direction in addition to the second pixel P2. In this instance, the transmitted data signal Dm may become different according to luminance realized by the respective pixels, and the data line 171 of the second pixel P2 transmits different voltages depending on timing of the compensation transistor T3 of the first pixel P1.

Further, a parasitic capacitor exists between the compensation transistor T3 and the data line 171. When a voltage applied to the parasitic capacitor changes as the voltage transmitted by the data line 171 changes, a channel potential of the compensation transistor T3 changes, so a kickback voltage is generated and becomes unstable. Accordingly, the defect of deteriorating displaying quality is generated in the display device in which the first electrode S3 of the compensation transistor T3 is connected to the second electrode D1 of the driving transistor T1, and whose luminance is determined by the driving transistor T1 connected to the OLED.

To prevent this problem, the shield layer M is provided on a top of the connection portion N3 of the compensation transistor T3 and is also provided between the two adjacent pixels P1 and P2, so the connection portion N3 is prevented from being influenced by transmission of different signals of the data line 171 of the second pixel P2, and displaying quality may be improved.

However, as the shield layer M is provided between two adjacent pixels P1 and P2, it partly overlaps the switching transistor T2, and particularly it may overlap the first electrode S2 of the switching transistor T2. The first electrode S2 is connected to the data line 171 through the opening 62, so a parasitic capacitance is additionally provided between the shield layer M and the data line 171.

Regarding an exemplary embodiment of the OLED display, the shield layer M is provided to overlap at least a part of the compensation transistor T3 and not overlap the switching transistor T2. In detail, the shield layer M overlaps the connection portion N3 for connecting the 3-1 transistor T3-1 and the 3-2 transistor T3-2 of the compensation transistor T3. The shield layer M, while not overlapping the switching transistor T2, may be provided between a bypass transistor T7 to be described and the data line 171 of the second pixel P2 adjacent in the first direction with the first pixel P1 on which the connection portion N3 is provided. In this instance, the shield layer M may overlap at least a part of the bypass transistor T7.

As described, the parasitic capacitance provided between the shield layer M and the switching transistor T2 may be removed by allowing the area where the shield layer M overlaps the switching transistor T2 to be zero. The first electrode S2 of the switching transistor T2 is connected to the data line 171 through the opening 62 as described above, so the parasitic capacitance generated by the data line 171 may be reduced.

An RC delay for causing a time delay in the display device is determined by resistance ("R") and capacitance ("C") of the display device. As described, as the parasitic capacitance reduces, the RC delay of the data line 171 reduces to decrease the RC delay of the display device, and power consumption of the display device may be resultantly improved, which will be described with reference to FIG. 2.

The first conductive layer includes the scan line 151, the previous scan line 152, the emission control line 153, and the gate electrode 155, and it may be a gate conductive layer. The second conductive layer includes a storage line 124, the first initialization voltage line 127, the second initialization voltage line 128, and a shield layer M. That is, the shield layer M is disposed in a same layer as a second conductive layer including the extended portion of the storage line 124 and the initialization voltage lines 127 and 128, and it is disposed on the semiconductor layer 130 and the first conductive layer.

The shield layer M is electrically connected to the lower voltage supplying line 172 through the opening C1 formed in a first interlayer insulating layer (161, refer to FIG. 3) to receive a driving voltage ELVDD, so it may receive a constant voltage. As described, the shield layer M receives the driving voltage ELVDD, so it may be stabilized for the compensation transistor T3 to be influenced by the different voltages transmitted through the data line 171.

Further, in an exemplary embodiment, the parasitic capacitance between the shield layer M and the data line 171 may be reduced by forming the shield layer M so as not to overlap with the switching transistor T2. Accordingly, the kickback voltage due to the parasitic capacitance is reduced and the defects such as image shaking or afterimages are reduced, and therefore, the displaying quality may be improved.

The shield layer M does not overlap the gate electrodes of the compensation transistors T3-1 and T3-2. In detail, the portion protruding upward from the scan line 151 overlaps the channel region of the 3-1 transistor T3-1 of the semiconductor layer 130 to form a gate electrode of the 3-1 transistor T3-1. Further, part of the extended portion of the scan line 151 in the first direction overlaps the channel region of the 3-2 transistor T3-2 of the semiconductor layer 130 to form a gate electrode of the 3-2 transistor T3-2. In other words, the shield layer M does not overlap the scan line 151 on which the gate electrode of the compensation transistor T3 is disposed.

Further, the shield layer M does not overlap the scan line 151, the previous scan line 152, the emission control line 153, and the gate electrode 155. That is, the shield layer M does not overlap the first conductive layer. In other words, the shield layer M is provided to be separated from the adjacent first conductive layer by a minimum distance, which will be described with reference to FIG. 2.

The insulating layer disposed between the first conductive layer and the second conductive layer is thin, so when the two layers overlap each other in a plan view, they may be shorted and a product characteristic may be deteriorated. Further, as the shield layer M approaches the portion protruding upward at the scan line 151, that is, the gate electrode of the 3-1 transistor T3-1, it also approaches an opening 67 for connecting the bypass transistor T7 to another layer. Accordingly, interference with other wires may be generated in the process for forming the opening 67, and the quality of the display device may be deteriorated. Therefore, the shield layer M disposed on the second conductive layer is provided not to overlap the first conductive layer.

The operation control transistor T5 may be referred to as a fifth transistor hereinafter.

The gate electrode of the operation control transistor T5 may be part of the emission control line 153. The lower voltage supplying line 172 is connected to the first electrode S5 of the operation control transistor T5 through an opening 68, and the second electrode D5 is connected to the first electrode S1 of the driving transistor T1 through the semiconductor layer 130.

The emission control transistor T6 may be referred to as a sixth transistor hereinafter.

The gate electrode of the emission control transistor T6 may be part of the emission control line 153. A fourth data connecting member 74 is connected to the second electrode D6 of the emission control transistor T6 through an opening 60, and the first electrode S6 is connected to the second electrode D1 of the driving transistor through the semiconductor layer 130. The fourth data connecting member 74, to be described later, may be provided in a same layer as the data line 171 or the lower voltage supplying line 172, and it is electrically connected to an auxiliary connecting member 179 to be described, and is resultantly connected to a pixel electrode (not shown) of the OLED.

The bypass transistor T7 may be referred to as a seventh transistor hereinafter.

A gate electrode G7 of the bypass transistor T7 may be part of the previous scan line 152. A first end of a third data connecting member 73 is connected to the second electrode D7 of the bypass transistor T7 through the opening 67, and a second end of the third data connecting member 73 is connected to the second initialization voltage line 128 through an opening 66 to receive an initialization voltage Vint. The first electrode S7 of the bypass transistor T7 is connected to the second electrode D6 of the emission control transistor T6.

The storage capacitor Cst includes the gate electrode 155 and an extended portion of the storage line 124 overlapping each other with the second gate insulating layer 142 (refer to FIG. 3) therebetween. The gate electrode 155 corresponds to a first storage electrode of the storage capacitor Cst, and the extended portion of the storage line 124 corresponds to the second storage electrode. Here, the second gate insulating layer 142 (refer to FIG. 3) provided between the gate electrode 155 and the storage line 124 becomes a dielectric material, and capacitance is determined by charges stored in the storage capacitor Cst and a voltage between the first and second storage electrodes. By the gate electrode 155 as a first storage electrode, the space for forming a storage capacitor Cst in the space narrowed by the channel of the driving transistor T1 occupying a large area in the pixel may be obtained.

The lower voltage supplying line 172 is connected to the extended portion of the storage line 124 through an opening 69. Hence, the storage capacitor Cst stores charges corresponding to a difference between the driving voltage ELVDD transmitted to the extended portion of the storage line 124 through the lower voltage supplying line 172 and the gate voltage of the gate electrode 155.

Regarding the first data layer, as described above, the plurality of data connecting members 71, 72, 73, and 74 may include the data line 171 and the lower voltage supplying line 172, and they may be disposed in a same layer with a same material.

A first end of the first data connecting member 71 is connected to the second electrode D3 of the compensation transistor T3 through the opening 63, and a second end thereof is connected to the gate electrode 155 through the opening 61 formed in the opening 56 formed in the extended portion of the storage line 124.

A first end of the second data connecting member 72 is connected to the first initialization voltage line 127 through the opening 64, and a second end thereof is connected to the first electrode S4 of the initialization transistor T4 through the opening 65.

A first end of the third data connecting member 73 is connected to the second initialization voltage line 128 through the opening 66, and a second end thereof is connected to the second electrode D7 of the bypass transistor T7 through the opening 67.

The fourth data connecting member 74 is connected to the second electrode D6 of the emission control transistor T6 through the opening 60. The fourth data connecting member 74 is electrically connected to the auxiliary connecting member 179 to be described, and is resultantly electrically connected to the pixel electrode (not shown) of the OLED.

As described, the data line 171, the lower voltage supplying line 172 and the plurality of data connecting members 71, 72, 73, and 74 may be disposed in a same layer, and in detail, they may be disposed on the first interlayer insulating layer 161 (refer to FIG. 3). In this instance, the lower voltage supplying line 172 supplies a constant electrical signal to a plurality of pixels, and so as to realize a high-quality display device, it is needed to prevent a voltage change such as a voltage drop. However, as shown in FIG. 1, the lower voltage supplying line 172 is provided in a same layer as the data line 171 and the plurality of connecting members 71, 72, 73, and 74, so it is difficult to acquire its area.

Therefore, a second data layer including an upper voltage supplying line 178 is provided on the first data layer. The second data layer may include the upper voltage supplying line 178 and the auxiliary connecting member 179.

The upper voltage supplying line 178 is electrically connected to the lower voltage supplying line 172 through an opening 81, thereby solving the voltage drop problem on the lower voltage supplying line 172. The upper voltage supplying line 178 may have a connected lattice shape in a plurality of pixel areas, and its detailed shape may be variable.

The auxiliary connecting member 179 is provided in a same layer as the upper voltage supplying line 178. As described above, the first electrode S7 of the bypass transistor T7 must be electrically connected to the pixel electrode (not shown) of the OLED. Therefore, the auxiliary connecting member 179 may be connected through an opening 83 to the fourth data connecting member 74 connected to the first electrode S7 of the bypass transistor T7 through the opening 60. The auxiliary connecting member 179 may be connected to a pixel electrode (not shown) through an opening 85 formed at the top of the auxiliary connecting member 179.

The OLED includes a pixel electrode (not shown) connected through the opening 85, an organic emission layer (not shown), and a common electrode (not shown).

Figure 2:
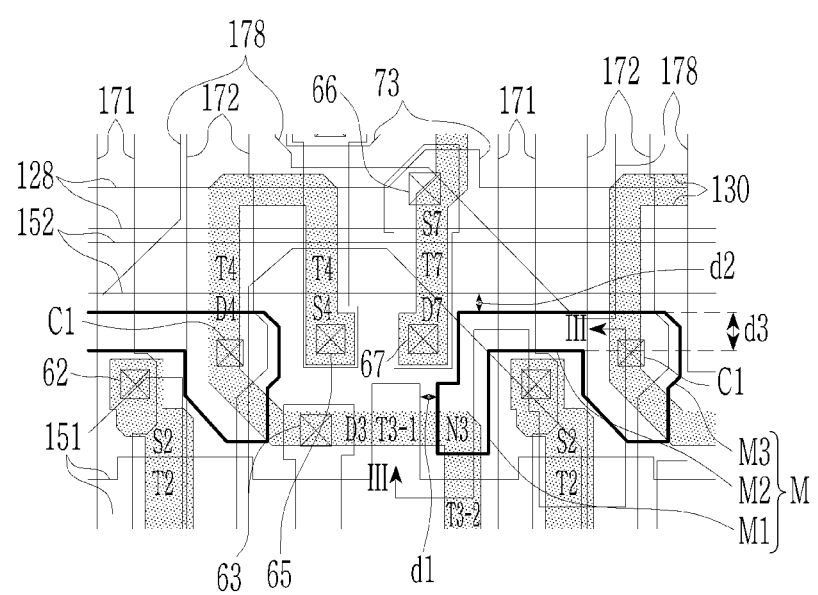
FIG. 2 shows an enlarged view of part of a pixel shown in FIG. 1.

An exemplary embodiment of disposal of a shield layer of an OLED display will now be described with reference to FIG. 2. FIG. 2 shows an enlarged view of part of a pixel shown in FIG. 1. In FIG. 2, the same configurations as those described with reference to FIG. 1 will use the same reference numerals, and the same contents as those described with reference to FIG. 1 will be omitted.

Referring to FIG. 2, the shield layer M includes an overlapping portion M1 for overlapping the connection portion N3, an extended portion M2 for extending from the overlapping portion M1, and an expanded portion M3 for expanding from the extended portion M2. The shield layer M may be provided to traverse a first pixel P1 and a second pixel P2 provided near the first pixel P1 in the first direction.

The overlapping portion M1 will now be described. The overlapping portion M1 does not overlap the scan line 151. That is, the shield layer M is separated from the scan line 151 with a constant gap therebetween. As described with reference to FIG. 1, a connection portion N3 is provided at a portion where 3-1 and 3-2 transistors T3-1 and T3-2 are connected. When a minimum distance between the overlapping portion M1 and a portion protruding upward from the scan line 151 is set to be a first gap d1, the first gap d1 may be about 1.2 micrometers (μm) to about 1.5 μm, and it may be about 1.2 μm, for example.

The overlapping portion M1 does not overlap the data line 171 of the second pixel P2 provided on a right side thereof. This is to minimize parasitic capacitance of the data line 171. Further, the overlapping portion M1 may be provided at a top of the connection portion N3 and substantially in parallel to the data line 171, and does not overlap the previous scan line 152.

The overlapping portion M1 overlaps the connection portion N3 and does not overlap the switching transistor T2, particularly the first electrode S2. When the shield layer M overlaps the switching transistor T2, the first electrode S2 of the switching transistor T2 is connected to the data line 171 through the opening 62, so the parasitic capacitance between the shield layer M and the data line 171 increases. Therefore, to prevent the generation of parasitic capacitance, in an exemplary embodiment, the shield layer M does not overlap the switching transistor T2 and is provided between the switching transistor T2 and the bypass transistor T7.

The shield layer M is shown that it does not overlap the bypass transistor T7 in FIG. 2, and it may overlap at least a part of the bypass transistor T7 in exemplary embodiments.

A width of the overlapping portion M1 is changeable by a portion where the same overlaps the connection portion N3 and a portion where the same does not overlap it, and the width may be larger at the portion where the same overlaps the connection portion N3.

The extended portion M2 extends in parallel to the previous scan line 152 toward the second pixel P2 from the overlapping portion M1. That is, the extended portion M2 may be disposed to traverse two adjacent pixels. The extended portion M2 is provided not to overlap the switching transistor T2, particularly the first electrode S2 according to the reason described with reference to the overlapping portion M1, thereby minimizing the parasitic capacitance of the data line 171.

The extended portion M2 does not overlap the previous scan line 152, and a second gap d2 between the extended portion M2 and the previous scan line 152 may be about 1.2 μm to about 1.5 μm, and it may be about 1.2 μm, for example.

The expanded portion M3 may be expanded along the semiconductor layer 130 extending below the second electrode D4 of the initialization transistor T4 from the extended portion M2. The expanded portion M3 is expanded only until it does not overlap the scan line 151. Although the distance between the expanded portion M3 and the scan line 151 is not shown, but it may be about 1.2 μm to about 1.5 μm, and about 1.2 μm, for example, in a like manner of the above-noted first gap d1 and the second gap d2.

The expanded portion M3 may overlap the initialization transistor T4 of the second pixel P2, particularly the second electrode D4. Further, the expanded portion M3 may receive the driving voltage ELVDD through the opening C1 formed in the first interlayer insulating layer 161 (refer to FIG. 3) provided on the expanded portion M3.

The expanded portion M3 does not overlap the switching transistor T2 to thus minimize the parasitic capacitance of the data line 171. Further, the width of the expanded portion M3 may vary according to a curved shape of the semiconductor layer 130 configuring the initialization transistor T4.

The overlapping portion M1, the extended portion M2, and the expanded portion M3 of the shield layer M may have different widths from one another.

A minimum width of the shield layer M is not limited by a specific number value, but it may be about 2.5 μm to about 3.3 μm, and it may be about 3.0 μm, for example. The minimum width of the shield layer M is shown in FIG. 2 to be a third gap d3 that is the width of the extended portion M2, which is only an example, and the minimum width of the shield layer M may be the width of the overlapping portion M1 or the expanded portion M3 instead of the extended portion M2.

The parasitic capacitance of the data line 171 may be minimized by minimizing the overlapping width of the shield layer M and the switching transistor T2 electrically connected to the data line 171. Accordingly, the RC delay of the data line 171 is reduced, and the RC delay of the display device is reduced, thereby improving display quality such as shaking of image displaying or afterimages.

In an exemplary embodiment, the shield layer M is disposed not to overlap the switching transistor T2, so the parasitic capacitance of the data line 171 may be reduced with a ratio of about 15% to about 20%, particularly a ratio of about 17%.

A stacked structure of an exemplary embodiment of an OLED display will now be described with reference to FIG. 3. FIG. 3 shows a cross-sectional view taken along line of FIG. 2.

In FIG. 3, the same configurations as those described in an exemplary embodiment will use the same reference numerals, and the same contents as those described in an exemplary embodiment will be omitted.

Referring to FIGS. 1, 2 and 3, an exemplary embodiment of the OLED display includes a substrate 110. The substrate 110 may include various materials such as glass, metal, or plastic. A barrier layer 111 is provided on the substrate 110. The barrier layer 111 may include an inorganic insulating material such as a silicon oxide, a silicon nitride, or an aluminum oxide, or it may include an organic insulating material such as polyimide acryl. The barrier layer 111 may prevent an impurity from being input to the transistor and may flatten one side of the substrate 110. The barrier layer 111 may be omitted in other exemplary embodiments.

The semiconductor layer 130 of the plurality of transistors T1, T2, T3, T4, T5, T6, and T7 is provided on the barrier layer 111. The semiconductor layer 130 includes first electrodes S1 to S7 and second electrodes D1 to D7 of the respective transistors. Detailed contents have been described so they will be omitted. In FIG. 3, the semiconductor layer 130 of the switching transistor T2, the compensation transistor T3, and the initialization transistor T4 is shown, and particularly, the first electrode S2 of the switching transistor T2, the connection portion N3 of the compensation transistor T3, and the second electrode D4 of the initialization transistor T4 are shown.

A first gate insulating layer 141 for covering the semiconductor layer 130 is provided on the semiconductor layer 130.

A first conductive layer is provided on the first gate insulating layer 141. The first conductive layer may include gate electrodes (including the gate electrode 155) of the plurality of transistors T1, T2, T3, T4, T5, T6, and T7, the scan line 151, the previous scan line 152, and the emission control line 153.

The second gate insulating layer 142 for covering the first conductive layer is provided on the first conductive layer. In an exemplary embodiment, the first gate insulating layer 141 and the second gate insulating layer 142 may include a material such as a silicon nitride, a silicon oxide, or an aluminum oxide.

A second conductive layer is provided on the second gate insulating layer 142. The second conductive layer includes the storage line 124, the first initialization voltage line 127, the second initialization voltage line 128, and the shield layer M, but the invention is not limited thereto.

The shield layer M is provided between the compensation transistor T3 and the data line 171 in a cross-sectional view, and it overlaps at least a part of the compensation transistor T3. Here, the compensation transistor T3 is provided at the bottom of the shield layer M, and the data line 171 is provided on the first data layer provided at the top of the shield layer M. Therefore, the shield layer M may prevent the additional generation of parasitic capacitance between the data line 171 and the compensation transistor T3, particularly the connection portion N3.

Further, the shield layer M does not overlap the switching transistor T2, particularly the first electrode S2. The switching transistor T2 is electrically connected to the data line 171 for supplying a data signal Dm through the opening 62 formed in the first gate insulating layer 141, the second gate insulating layer 142, and the first interlayer insulating layer 161. The shield layer M is provided not to overlap the switching transistor T2, thereby eliminating the parasitic capacitance between the shield layer M and the data line 171.

In addition, the shield layer M may overlap the initialization transistor T4, particularly the second electrode D4. In this instance, the shield layer M is connected to the lower voltage supplying line 172 through the opening C1 formed in the first interlayer insulating layer 161, and receives the driving voltage ELVDD. Accordingly, a constant voltage is applied to the shield layer M to prevent the change of voltage, reduce the kickback voltage that causes image defects, and thereby improve the displaying quality.

The first interlayer insulating layer 161 for covering the second conductive layer is provided on the second conductive layer. In an exemplary embodiment, the first interlayer insulating layer 161 may include a material such as a silicon nitride, a silicon oxide, or an aluminum oxide, and it may include an organic insulating material.

The first data layer is provided on the first interlayer insulating layer 161. The first data layer may include the data line 171, the lower voltage supplying line 172, the first data connecting member 71, the second data connecting member 72, the third data connecting member 73, and the fourth data connecting member 74. The first data layer may be electrically connected to the semiconductor layer 130 provided at the bottom through the openings 60, 61, 62, 63, 64, 65, 66, 67, 68, and 69 formed in at least a part of the first gate insulating layer 141, the second gate insulating layer 142, and the first interlayer insulating layer 161.

The first data layer may become first electrodes S1, S2, S3, S4, S5, S6, and S7 and second electrodes D1, D2, D3, D4, D5, D6, and D7 connected to the first region and the second region of the semiconductor layer 130. When one of the first electrodes S1, S2, S3, S4, S5, S6, and S7 and the second electrodes D1, D2, D3, D4, D5, D6, and D7 is a source electrode, the other may be a drain electrode. In detail, in FIG. 3, the data line 171 is electrically connected to the first electrode S2 of the switching transistor T2 provided at the bottom through the opening 62 formed in the first gate insulating layer 141, the second gate insulating layer 142, and the first interlayer insulating layer 161. The lower voltage supplying line 172 is connected to the shield layer M, particularly the expanded portion M3, through the opening C1 formed in the first interlayer insulating layer 161.

A second interlayer insulating layer 162 is provided on the first data layer. In an exemplary embodiment, the second interlayer insulating layer 162 may include a material such as a silicon nitride, a silicon oxide, or an aluminum oxide, and it may include an organic insulating material.

A second data layer is provided on the second interlayer insulating layer 162. The second data layer may include the upper voltage supplying line 178 and the auxiliary connecting member 179. Although not shown in FIG. 3, the second data layer may be, as described with reference to FIG. 1, electrically connected to the first data layer provided at the bottom through the openings 81 and 83 formed in the second interlayer insulating layer 162.

In detail, the upper voltage supplying line 178 may be connected to the lower voltage supplying line 172 through the opening 81 formed in the second interlayer insulating layer 162 to prevent the voltage drop of the lower voltage supplying line 172. The auxiliary connecting member 179 may be connected to the fourth data connecting member 74 through the opening 83 formed in the second interlayer insulating layer 162. As described with reference to FIG. 1, the fourth data connecting member 74 may be connected to the semiconductor layer 130 provided at the bottom, particularly the second electrode D6 of the emission control transistor T6 through the opening 60 formed in at least a part of the first gate insulating layer 141, the second gate insulating layer 142, and the first interlayer insulating layer 161. Therefore, the auxiliary connecting member 179 may be connected to the semiconductor layer 130 at the bottom, particularly the second electrode D6 of the emission control transistor T6.

A passivation layer 180 for covering the same is provided. The passivation layer 180 that is also referred to as a planarization film may include an organic insulating material.

A pixel electrode (not shown) is provided on the passivation layer 180. The pixel electrode is connected to the auxiliary connecting member 179 through the opening 85 (refer to FIG. 1) formed in the passivation layer 180. A partition wall (not shown) is provided on the passivation layer 180 and the pixel electrode. An open portion overlapping the pixel electrode is defined in the partition wall, and an organic emission layer is provided on the open portion. A common electrode (not shown) is provided on the organic emission layer and the partition wall. The pixel electrode, the organic emission layer, and the common electrode configure an OLED.

In exemplary embodiments, the pixel electrode may be an anode that is a hole injection electrode, and the common electrode may be a cathode that is an electron injection electrode. On the contrary, in other exemplary embodiments, the pixel electrode may be a cathode, and the common electrode may be an anode. When holes and electrons are injected into the organic emission layer from the pixel electrode and the common electrode, excitons that are a combination of the injected holes and electrons transit to the ground state from the excited state.

An exemplary embodiment of an OLED display will now be described with reference to FIGS. 4 and 5.

Figure 5:
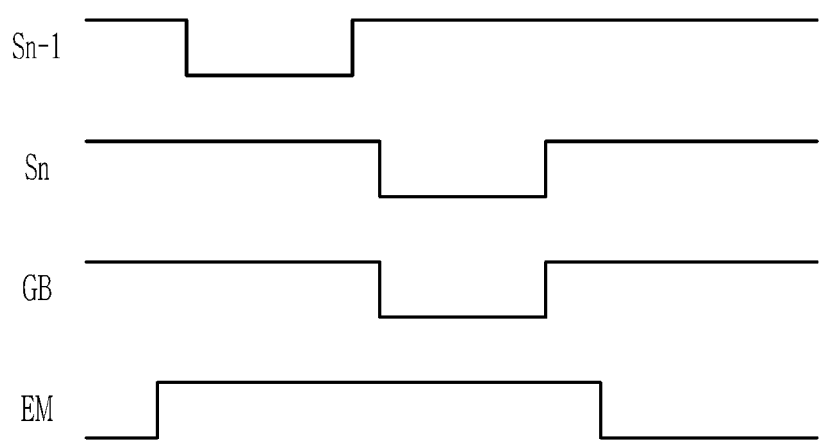
FIG. 5 shows a timing diagram of an exemplary embodiment of signals applied to a pixel of an OLED display.

FIG. 4 shows an equivalent circuit diagram of an exemplary embodiment of a pixel of an OLED display, and FIG. 5 shows an exemplary embodiment of a timing diagram of signals applied to a pixel of an OLED display. Hereinafter, the same configurations as those described in an exemplary embodiment will use the same reference numerals, and the same contents as those described in an exemplary embodiment will be omitted.

Referring to FIG. 4, an exemplary embodiment of one pixel of an OLED display includes a plurality of signal lines 151, 152, 153, 158, 127, 128, and 171, a plurality of transistors T1, T2, T3 (refer to FIG. 3), T4, T5, T6, and T7 connected to the plurality of signal lines, a storage capacitor Cst, voltage supplying lines 172 and 178, and an OLED.

The plurality of signal lines apply a scan signal Sn, a previous scan signal Sn-1, a bypass signal GB, an emission control signal EM, and an initialization voltage Vint, respectively, and include a scan line 151, a previous scan line 152, an emission control line 153, a bypass control line 158, and initialization voltage lines 127 and 128 disposed in a row direction. They may include a data line 171 and voltage supplying lines 172 and 178 traversing the scan line 151, the previous scan line 152, the emission control line 153, the bypass control line 158, and the initialization voltage lines 127 and 128, and applying a data signal Dm and a driving voltage ELVDD to the pixels.

The scan line 151 is connected to a gate driver (not shown) to transmit a scan signal Sn to the switching transistor T2 and the third transistor T3. The previous scan line 152 is connected to the gate driver to transmit a previous scan signal Sn-1 applied to the pixel provided at a previous position to the fourth transistor T4. The fourth transistor T4 includes two transistors connected in series, so the previous scan signal Sn-1 is applied to the gate electrodes of the two transistors connected in series and included in the fourth transistor T4.

The emission control line 153 is connected to an emission controller (not shown), and it transmits an emission control signal EM for controlling a time when an OLED emits light to the fifth transistor T5 and the sixth transistor T6. The bypass control line 158 transmits the bypass signal GB to the seventh transistor T7, and in some exemplary embodiments, may transmit a same signal as the previous scan signal Sn-1 or the scan signal Sn thereto.

The data line 171 transmits the data signal Dm generated by a data driver (not shown), and luminance of the light emitted by the OLED changes according to the data signal Dm. The lower voltage supplying line 172 applies the driving voltage ELVDD. The first initialization voltage line 127 transmits the initialization voltage Vint for initializing the driving transistor T1, and second initialization voltage line 128 transmits the initialization voltage Vint for initializing the anode of the OLED. A common voltage line 741 applies the common voltage ELVSS. The voltages applied to the lower voltage supplying line 172, the initialization voltage lines 127 and 128, and the common voltage line 741 may respectively be a constant voltage.

The plurality of transistors may include a driving transistor T1, a switching transistor T2, a compensation transistor T3, an initialization transistor T4, an operation control transistor T5, an emission control transistor T6, and a bypass transistor T7.

The plurality of transistors T1, T2, T3, T4, T5, T6, and T7 will now be described.

First, the driving transistor T1 controls a current output according to the applied data signal Dm, the output driving current Id is applied to the OLED, and brightness of the OLED is controlled by the data signal Dm. For this purpose, the first electrode S1 of the driving transistor T1 is disposed to receive the driving voltage ELVDD, and it is connected to the lower voltage supplying line 172 through the operation control transistor T5. Further, the first electrode S1 of the driving transistor T1 is connected to the second electrode D2 of the switching transistor T2 to receive the data signal Dm. The second electrode D1 (i.e., an electrode on the output side) is disposed to output a current to the OLED, and is connected to the anode of the OLED through the emission control transistor T6.

The gate electrode G1 is connected to one electrode (the first storage electrode E1 of the storage capacitor Cst. The voltage at the gate electrode G1 changes according to the voltage stored in the storage capacitor Cst, and the driving current Id output by the driving transistor T1 changes. The storage capacitor Cst maintains the voltage applied to the gate electrode G1 of the driving transistor T1.

The switching transistor T2 receives the data signal Dm into the pixel. The gate electrode G2 is connected to the scan line 151, and the first electrode S2 is connected to the data line 171. The second electrode D2 of the switching transistor T2 is connected to the first electrode S1 of the driving transistor T1. When the switching transistor T2 is turned on according to the scan signal Sn transmitted through the scan line 151, the data signal Dm transmitted through the data line 171 is transmitted to the first electrode S1 of the driving transistor T1.

The compensation transistor T3 and the initialization transistor T4 are shown with a configuration to include two transistors connected in series. Here, the configuration of connection in series represents a configuration in which gate electrodes of two transistors T3-1 and T3-2 are connected to receive the same signal, and an output of one transistor is applied to the input of the other transistor.

The compensation transistor T3 has a configuration in which the 3-1 and 3-2 transistors T3-1 and T3-2 are connected in series. The gate electrode G3-1 of the 3-1 transistor T3-1 and the gate electrode G3-2 of the 3-2 transistor T3-2 are connected to each other.

The compensation transistor T3 transmits a compensation voltage (the voltage of Dm+Vth) that is changed when the data signal Dm passes through the driving transistor T1 to the first storage electrode E1 of the storage capacitor Cst. The compensation transistor T3 includes the 3-1 transistor T3-1 and the 3-2 transistor T3-2 connected in series. The gate electrodes G3-1 and G3-2 of the two transistors T3-1 and T3-2 are connected to the scan line 151. The first electrode S3-2 of the 3-2 transistor T3-2 is connected to the second electrode D1 of the driving transistor T1, and the second electrode D3-1 of the 3-1 transistor T3-1 is connected to the first storage electrode E1 of the storage capacitor Cst and the gate electrode G1 of the driving transistor T1.

Further, the first electrode S3-1 of the 3-1 transistor T3-1 and the second electrode D3-2 of the 3-2 transistor T3-2 are connected to each other at the connection portion N3. The connection portion N3 may be a connection node where the two transistors T3-1 and T3-2 are connected to each other.

In the case of describing the compensation transistor T3 as a single transistor, the first electrode S3-2 of the 3-2 transistor T3-2 becomes the first electrode S3 of the compensation transistor T3, and the second electrode D3-1 of the 3-1 transistor T3-1 becomes the second electrode D3 of the compensation transistor T3. The compensation transistor T3 is turned on by the scan signal Sn received through the scan line 151 to connect the gate electrode G1 of the driving transistor T1 and the second electrode D1, and to also connect the second electrode D1 of the driving transistor T1 and the first storage electrode E1 of the storage capacitor Cst. In this instance, parasitic capacitance Cp is generated between part of the compensation transistor T3 and the data line 171.

An exemplary embodiment of the OLED display further includes a shield layer M. The shield layer M overlaps the connection portion N3 for connecting the compensation transistor T3, particularly the 3-1 transistor T3-1 and the 3-2 transistor T3-2. The first electrode S2 of the switching transistor T2 receives a data signal Dm from the data line 171. The shield layer M is provided not to overlap the switching transistor T2, thereby eliminating the parasitic capacitance between the shield layer M and the data line 171. Hence, capacitance of the parasitic capacitor Cp of the data line 171 may be reduced, the RC delay of the data line 171 is reduced, and power consumption of the display device may be resultantly improved.

The initialization transistor T4 initializes the gate electrode G1 of the driving transistor T1 and the first storage electrode E1 of the storage capacitor Cst. The gate electrode G4 is connected to the previous scan line 152, and the first electrode S4 is connected to the first initialization voltage line 127. The second electrode D4 of the initialization transistor T4 is connected to the first storage electrode E1 of the storage capacitor Cst and the gate electrode G1 of the driving transistor T1 through the second electrode D3 of the compensation transistor T3.

The initialization transistor T4 transmits the initialization voltage Vint to the gate electrode G1 of the driving transistor T1 and the first storage electrode E1 of the storage capacitor Cst according to the previous scan signal Sn-1 received through the previous scan line 152. Accordingly, the gate voltage of the gate electrode G1 of the driving transistor T1 and the storage capacitor Cst are initialized. The initialization voltage Vint may be a voltage having a low value and turning on the driving transistor T1.

The initialization transistor T4 has a configuration including two transistors connected in series. The initialization transistor T4 is connected in series, and it may be provided with a single transistor in exemplary embodiments.

The operation control transistor T5 transmits the driving voltage ELVDD to the driving transistor T1. The gate electrode G5 is connected to the emission control line 153, and the first electrode S5 is connected to the lower voltage supplying line 172. The second electrode D5 of the operation control transistor T5 is connected to the first electrode S1 of the driving transistor T1.

The emission control transistor T6 transmits the driving current Id output by the driving transistor T1 to the OLED. The gate electrode G6 is connected to the emission control line 153, and the first electrode S6 is connected to the second electrode D1 of the driving transistor T1. The second electrode D6 of the emission control transistor T6 is connected to the anode of the OLED.

The operation control transistor T5 and the emission control transistor T6 are simultaneously turned on according to the emission control signal EM received through the emission control line 153, and when the driving voltage ELVDD is applied to the first electrode S1 of the driving transistor T1 through the operation control transistor T5, the driving transistor T1 outputs the driving current Id according to the voltage of the gate electrode G1 of the driving transistor T1 (i.e., the voltage of the first storage electrode E1 of the storage capacitor Cst). The output driving current Id is transmitted to the OLED through the emission control transistor T6. As the current Ioled flows to the OLED, the OLED emits light.

The bypass transistor T7 initializes the anode of the OLED. The gate electrode G7 is connected to the bypass control line 158, the first electrode S7 is connected to the anode of the OLED, and the second electrode D7 is connected to the second initialization voltage line 128. In exemplary embodiments, when the bypass control line 158 is connected to the previous scan line 152, the bypass signal GB may be a signal with the same timing as the previous scan signal Sn-1, and when the bypass control line 158 is connected to the scan line 151, the bypass signal GB may be a signal with the same timing as the scan signal Sn. When the bypass transistor T7 is turned on by the bypass signal GB, the initialization voltage Vint is applied to the anode of the OLED to be initialized.

The first storage electrode E1 of the storage capacitor Cst is connected to the gate electrode G1 of the driving transistor T1, the second electrode D3 of the compensation transistor T3, and the second electrode D4 of the initialization transistor T4, and the second storage electrode E2 is connected to the lower voltage supplying line 172. As a result, the first storage electrode E1 determines the voltage at the gate electrode G1 of the driving transistor T1. And the first storage electrode E1 receives the data signal Dm through the second electrode D3 of the compensation transistor T3, and receives the initialization voltage Vint through the second electrode D4 of the initialization transistor T4.

A circuit of one pixel in an exemplary embodiment includes seven transistors T1 to T7 and one capacitor Cst, but the invention is not limited thereto, and the number of transistors and capacitors and their combinations are modifiable in various ways.

Although not shown, the OLED display includes a display area for displaying an image, and the pixels are arranged in the display area in various ways such as in a matrix form.

An exemplary embodiment of an operation of one pixel of an OLED display will now be described with reference to FIG. 5.

Referring to FIG. 5, a low-level previous scan signal Sn-1 is supplied to the pixel through the previous scan line 152 during an initialization section. Upon receiving the same, the initialization transistor T4 is turned on such that the initialization voltage Vint is applied to the gate electrode G1 of the driving transistor T1 and the first storage electrode E1 of the storage capacitor Cst through the initialization transistor T4. As a result, the driving transistor T1 and the storage capacitor Cst are initialized. The voltage of the initialization voltage Vint may be a low voltage, and the driving transistor T1 may be turned on.

The bypass transistor T7 in the initialization section may initialize the anode of the OLED, and may prevent the small amount of current discharged in the condition that the driving transistor T1 is not turned on from being applied to the OLED. Here, the small amount of current is a bypass current Ibp (refer to FIG. 4), and is discharged to the initialization voltage Vint end through the bypass transistor T7. As a result, the OLED does not discharge unneeded light so that the black gray may be displayed more clearly and the contrast ratio may be improved. In this case, the bypass signal GB may be a signal with the same timing as the scan signal Sn, and in an exemplary embodiment, it may be a signal with the same timing as the previous scan signal Sn-1. The bypass transistor T7 may be omitted in other exemplary embodiments.

During a data programming section, a low-level scan signal Sn is supplied to the pixel through the scan line 151. In this instance, the bypass signal GB with the same timing as the scan signal Sn may be supplied. The switching transistor T2 and the compensation transistor T3 are turned on by the low-level scan signal Sn.

When the switching transistor T2 is turned on, the data signal Dm is applied to the first electrode S1 of the driving transistor T1 through the switching transistor T2.

In this instance, parasitic capacitance may be formed between the data line 171 for supplying the data signal Dm and the switching transistor T2 or the compensation transistor T3. In an exemplary embodiment of the OLED display, the shield layer M is provided to overlap the compensation transistor T3, particularly the connection portion N3, to thus reduce the parasitic capacitance caused by the data line 171 and the compensation transistor T3. Further, the shield layer M is provided not to overlap the switching transistor T2 for receiving the data signal Dm to thereby eliminate the parasitic capacitance caused by the data line 171 and the compensation transistor T3.

Accordingly, the parasitic capacitance of the data line 171 may be minimized in the OLED display in an exemplary embodiment, thereby minimizing the RC delay of the data line 171, and finally improving the display quality of the display device while reducing power consumption.

Further, during the data programming section, the compensation transistor T3 is turned on, and as a result, the second electrode D1 of the driving transistor T1 is electrically connected to the gate electrode G1 and the first storage electrode E1 of the storage capacitor Cst. The gate electrode G1 of the driving transistor T1 and the second electrode D1 of the driving transistor T1 are diode-connected. During the initialization section, the driving transistor T1 is turned on because a low voltage (initialization voltage Vint) is applied to the gate electrode G1. As a result, the data signal Dm input to the first electrode S1 of the driving transistor T1 passes through the channel of the driving transistor T1, is output by the second electrode D1, passes through the compensation transistor T3, and is stored in the first storage electrode E1 of the storage capacitor Cst.

In this instance, the voltage applied to the first storage electrode E1 changes according to the threshold voltage Vth of the driving transistor T1, the voltage at the first electrode S1 of the driving transistor T1 is the data signal Dm, and when the voltage at the gate electrode G1 of the driving transistor T1 is the initialization voltage Vint, the voltage output to the second electrode D1 may be Vgs+Vth. Here, as described above, the voltage Vgs is a voltage difference between the gate electrode G1 of the driving transistor T1 and the first electrode S1, so it may have the value of Dm-Vint. Therefore, the voltage output by the second electrode D1 and stored in the first storage electrode E1 may have the value of Dm-Vint+Vth.

During an emission section, the emission control signal EM supplied by the emission control line 153 has a low-level value, so the operation control transistor T5 and the emission control transistor T6 are turned on. As a result, the driving voltage ELVDD is applied to the first electrode S1 of the driving transistor T1, and the second electrode D1 of the driving transistor T1 is connected to the OLED. The driving transistor T1 generates a driving current Id according to the voltage difference between the voltage at the gate electrode G1 and the voltage (i.e., the driving voltage ELVDD) at the first electrode S1.

Regarding the calculation equations, the value of Vth may be slightly greater than zero or a negative value in the case of a P-type transistor using a polycrystalline semiconductor. Further, the expression of + and – is changeable according to the voltage calculating direction. When the emission section is finished, the initialization section is provided to repeat the same operation from the start.

One of the first electrodes and the second electrodes of the plurality of transistors T1, T2, T3, T4, T5, T6, and T7 may be source electrodes and the other thereof may be drain electrodes according to the voltage or current applying direction.

Further, in exemplary embodiments, during the initialization section, the low-level bypass signal GB may be applied to the bypass transistor T7. Upon receiving the same, the bypass transistor T7 is turned on, so the initialization voltage Vint is applied to the anode of the OLED through the bypass transistor T7. As a result, the anode of the OLED is initialized.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
   a substrate;
   a first pixel and a second pixel disposed on the substrate; and
   a plurality of first shield patterns disposed on the substrate,
   wherein each of the first pixel and the second pixel comprises:
   a driving transistor including a first gate electrode, a first channel region disposed in a semiconductor layer, a first electrode electrically connected to a driving voltage line transmitting a driving voltage, and a second electrode,
   a second transistor including a second gate electrode, a second channel region disposed in the semiconductor layer, a first electrode, and a second electrode connected to the first electrode of the driving transistor,
   a third transistor including a third gate electrode, a third channel region disposed in the semiconductor layer, a first electrode connected to the second electrode of the driving transistor, and a second electrode connected to the first gate electrode of the driving transistor,
   a fourth transistor including a fourth gate electrode, a fourth channel region disposed in the semiconductor layer, a first electrode connected to the second electrode of the third transistor, and a second electrode connected to an initialization voltage line,
   a first contact portion connects the first electrode of the second transistor to a corresponding data line, and
   an organic light emitting diode including an anode electrically connected to the second electrode of the driving transistor,
   wherein the third transistor involved in each of the first pixel and the second pixel respectively includes a first sub transistor and a second sub transistor connected in series to each other at a first semiconductor connection portion disposed in the semiconductor layer,
   wherein the third transistor and the fourth transistor involved in each of the first pixel and the second pixel are respectively connected to each other at a second semiconductor connection portion disposed between the third channel region and the fourth channel region in the semiconductor layer,
   wherein the first electrode of the second transistor is disposed in the semiconductor layer and disposed between the second channel region and the first contact portion in each of the first pixel and the second pixel,
   wherein each of the first semiconductor connection portion and the second semiconductor connection portion involved in each of the first pixel and the second pixel overlaps at least a portion of a corresponding one of the plurality of first shield patterns,
   wherein the first electrode of the second transistor involved in each of the first pixel and the second pixel does not overlap any one of the plurality of first shield patterns, and
   wherein the plurality of first shield patterns receive the driving voltage.

2. The organic light emitting diode display of claim 1, further comprises:
   a first conductive layer disposed on the semiconductor layer,
   a second conductive layer disposed on the first conductive layer, and
   a first data layer disposed on the second conductive layer,
   wherein the first conductive layer includes the first gate electrode and the second gate electrode.

3. The organic light emitting diode display of claim 2, wherein the second conductive layer includes the plurality of first shield patterns.

4. The organic light emitting diode display of claim 3, wherein:
   the first data layer includes a plurality of voltage lines connected to adjacent pixels, and
   each of the plurality of first shield patterns overlaps a corresponding one of the plurality of voltage lines.

5. The organic light emitting diode display of claim 2, further comprising:
   a first signal line connected to the second gate electrode, and
   a second signal line connected to the third gate electrode,
   wherein the first conductive layer further includes the first signal line and the second signal line.

6. The organic light emitting diode display of claim 5, wherein the first signal line is a scan line which transmits a scan signal.

7. The organic light emitting diode display of claim 6, wherein the second signal line is a previous scan line which transmits a previous scan signal.

8. The organic light emitting diode display of claim 1, wherein:
   the second gate electrode of the second transistor is connected to a scan line extending in a first direction, and
   the plurality of first shield patterns respectively include an extending portion and a first portion,
   the extending portion extends in a substantially same direction as the first direction,
   the first semiconductor connection portion in each of the first pixel and the second pixel respectively overlaps the first portion of a corresponding one of the plurality of first shield patterns, and
   the first portion is extended from the extending portion.

9. The organic light emitting diode display of claim 8, wherein the first pixel and the second pixel are disposed adjacent in the first direction.

10. The organic light emitting diode display of claim 8, wherein:
    the second semiconductor connection portion is electrically connected to the first gate electrode of the driving transistor at a second contact portion,
    each of the plurality of first shield patterns further includes a second portion, respectively, and
    the second portion is disposed between the second contact portion and the first contact portion in each of the first pixel and the second pixel in a plan view.

11. The organic light emitting diode display of claim 10, wherein the second portion is disposed at an opposite end to the first portion with respect to the extending portion.

12. The organic light emitting diode display of claim 11, wherein the first portion and the second portion are protruded from a corresponding end of the extending portion.

13. The organic light emitting diode display of claim 12, wherein the first portion and the second portion are protruded in a same direction from the extending portion.

14. The organic light emitting diode display of claim 10, wherein the second portion receives the driving voltage from the driving voltage line.

15. The organic light emitting diode display of claim 14, wherein the second portion overlaps at least a part of the fourth transistor.

16. The organic light emitting diode display of claim 10, wherein the second contact portion is an opening connecting the second electrode of the third transistor and a first data connecting member, and
the first data connecting member is electrically connected to the first gate electrode of the driving transistor.

17. The organic light emitting diode display of claim 1, wherein the first semiconductor connection portion is disposed as a bent pattern of the semiconductor layer.

18. The organic light emitting diode display of claim 1, wherein the driving voltage line is disposed in a same layer as the data line.

19. The organic light emitting diode display of claim 1, further comprising:
an auxiliary connecting member disposed in a same layer as the data line, and electrically connected to the anode of the organic light emitting diode.

20. The organic light emitting diode display of claim 1, wherein the driving voltage has a constant voltage level.

21. The organic light emitting diode display of claim 1, wherein the first contact portion is an opening connecting the corresponding data line and the first electrode of the second transistor disposed in the semiconductor layer.

22. An electronic device for displaying image comprising:
a substrate;
a first pixel and a second pixel disposed on the substrate; and
a plurality of first shield patterns disposed on the substrate,
wherein each of the first pixel and the second pixel comprises:
a driving transistor including a first gate electrode, a first channel region disposed in a semiconductor layer, a first electrode electrically connected to a driving voltage line transmitting a driving voltage, and a second electrode,
a second transistor including a second gate electrode, a second channel region disposed in the semiconductor layer, a first electrode, and a second electrode connected to the first electrode of the driving transistor,
a third transistor including a third gate electrode, a third channel region disposed in the semiconductor layer, a first electrode connected to the second electrode of the driving transistor, and a second electrode connected to the first gate electrode of the driving transistor,
a fourth transistor including a fourth gate electrode, a fourth channel region disposed in the semiconductor layer, a first electrode connected to the second electrode of the third transistor, and a second electrode connected to an initialization voltage line,
a first contact portion connects the first electrode of the second transistor to a corresponding data line, and
an organic light emitting diode including an anode electrically connected to the second electrode of the driving transistor,
wherein the third transistor involved in each of the first pixel and the second pixel respectively includes a first sub transistor and a second sub transistor connected in series to each other at a first semiconductor connection portion disposed in the semiconductor layer,
wherein the third transistor and the fourth transistor involved in each of the first pixel and the second pixel are respectively connected to each other at a second semiconductor connection portion disposed between the third channel region and the fourth channel region in the semiconductor layer,
wherein the first electrode of the second transistor is disposed in the semiconductor layer and disposed between the second channel region and the first contact portion in each of the first pixel and the second pixel,
wherein each of the first semiconductor connection portion and the second semiconductor connection portion involved in each of the first pixel and the second pixel overlaps at least a portion of a corresponding one of the plurality of first shield patterns,
wherein the first electrode of the second transistor involved in each of the first pixel and the second pixel does not overlap any one of the plurality of first shield patterns, and
wherein the plurality of first shield patterns receive the driving voltage.

23. The electronic device for displaying image of claim 22, further comprises:
a first conductive layer disposed on the semiconductor layer,
a second conductive layer disposed on the first conductive layer, and
a first data layer disposed on the second conductive layer,
wherein the first conductive layer includes the first gate electrode and the second gate electrode.

24. The electronic device for displaying image of claim 23, wherein the second conductive layer includes the plurality of first shield patterns.

25. The electronic device for displaying image of claim 24, wherein:
the first data layer includes a plurality of voltage lines connected to adjacent pixels, and
each of the plurality of first shield patterns overlaps a corresponding one of the plurality of voltage lines.

26. The electronic device for displaying image of claim 22, wherein:
the second gate electrode of the second transistor is connected to a scan line extending in a first direction, and
the plurality of first shield patterns respectively include an extending portion and a first portion,
the extending portion extends in a substantially same direction as the first direction,
the first semiconductor connection portion in each of the first pixel and the second pixel respectively overlaps the first portion of a corresponding one of the plurality of first shield patterns, and
the first portion is extended from the extending portion.

27. The electronic device for displaying image of claim 26, wherein the first pixel and the second pixel are disposed adjacent in the first direction.

28. The electronic device for displaying image of claim 26, wherein:

the second semiconductor connection portion is electrically connected to the first gate electrode of the driving transistor at a second contact portion, each of the plurality of first shield patterns further includes a second portion, respectively, and the second portion is disposed between the second contact portion and the first contact portion in each of the first pixel and the second pixel in a plan view.

29. The electronic device for displaying image of claim 28, wherein the second portion is disposed at an opposite end to the first portion with respect to the extending portion.

30. The electronic device for displaying image of claim 29, wherein the first portion and the second portion are protruded from a corresponding end of the extending portion.

31. The electronic device for displaying image of claim 30, wherein the first portion and the second portion are protruded in a same direction from the extending portion.

32. The electronic device for displaying image of claim 28, wherein the second portion receives the driving voltage from the driving voltage line.

33. The electronic device for displaying image of claim 32, wherein the second portion overlaps at least a part of the fourth transistor.

34. The electronic device for displaying image of claim 33, further comprising:
a first signal line connected to the second gate electrode, and
a second signal line connected to the third gate electrode,
wherein the first conductive layer further includes the first signal line and the second signal line.

35. The electronic device for displaying image of claim 34, wherein the first signal line is a scan line which transmits a scan signal.

36. The electronic device for displaying image of claim 35, wherein the second signal line is a previous scan line which transmits a previous scan signal.

37. The electronic device for displaying image of claim 28, wherein the second contact portion is an opening connecting the second electrode of the third transistor and a first data connecting member, and
the first data connecting member is electrically connected to the first gate electrode of the driving transistor.

38. The electronic device for displaying image of claim 22, wherein the first semiconductor connection portion is disposed as a bent pattern of the semiconductor layer.

39. The electronic device for displaying image of claim 22, wherein the driving voltage line is disposed in a same layer as the data line.

40. The electronic device for displaying image of claim 22, further comprising:
an auxiliary connecting member disposed in a same layer as the data line, and electrically connected to the anode of the organic light emitting diode.

41. The electronic device for displaying image of claim 22, wherein the driving voltage has a constant voltage level.

42. The electronic device for displaying image of claim 22, wherein the first contact portion is an opening connecting the corresponding data line and the first electrode of the second transistor disposed in the semiconductor layer.

* * * * *